United States Patent
Zhang et al.

(10) Patent No.: US 8,712,354 B2
(45) Date of Patent: *Apr. 29, 2014

(54) RADIO TRANSMITTER AND RADIO RECEIVER WITH CHANNEL CONDITION ASSESSMENT

(75) Inventors: Yifeng Zhang, San Jose, CA (US); Tracey Lee Chavers, Fremont, CA (US); Peiqi Xuan, Saratoga, CA (US); Qifa Wu, Beijing (CN)

(73) Assignee: Quintic Holdings, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/485,907

(22) Filed: May 31, 2012

(65) Prior Publication Data

US 2012/0238228 A1    Sep. 20, 2012

Related U.S. Application Data

(60) Division of application No. 12/473,281, filed on May 28, 2009, now Pat. No. 8,238,844, and a continuation-in-part of application No. 12/137,535, filed on Jun. 11, 2008.

(51) Int. Cl.
    *H04B 1/18*       (2006.01)
    *H04B 7/00*       (2006.01)
    *H04W 4/00*      (2009.01)
    *H04W 72/00*     (2009.01)

(52) U.S. Cl.
USPC .................. 455/160.1; 455/161.1; 455/161.3; 455/180.1

(58) Field of Classification Search
USPC ........ 455/130, 133–135, 150.1, 154.1, 160.1, 455/161.1, 161.2, 161.3, 179.1, 180.1, 455/184.1, 185.1, 186.1, 188.1, 67.11, 455/17.13, 434, 450, 452.2, 509, 513
See application file for complete search history.

(56) References Cited

U.S. PATENT DOCUMENTS

| | | | |
|---|---|---|---|
| 6,810,233 B2 * | 10/2004 | Patsiokas | 455/3.02 |
| 7,062,238 B2 * | 6/2006 | Glaza | 455/161.1 |
| 7,272,375 B2 | 9/2007 | Tuttle et al. | |
| 7,512,380 B2 * | 3/2009 | McGowan | 455/63.3 |
| 7,796,947 B2 * | 9/2010 | Kim | 455/62 |
| 7,801,497 B1 * | 9/2010 | Lam | 455/120 |
| 7,941,141 B2 * | 5/2011 | Shoykhet et al. | 455/434 |
| 2003/0236075 A1 * | 12/2003 | Johnson et al. | 455/99 |
| 2008/0214101 A1 * | 9/2008 | Voto | 455/3.02 |
| 2008/0220730 A1 * | 9/2008 | Borremans | 455/101 |
| 2009/0054020 A1 * | 2/2009 | Mason | 455/127.5 |
| 2009/0270047 A1 * | 10/2009 | Heijnen | 455/77 |
| 2009/0275299 A1 * | 11/2009 | Buch et al. | 455/161.1 |
| 2010/0285732 A1 * | 11/2010 | Sinton et al. | 455/3.01 |

* cited by examiner

*Primary Examiner* — Pablo Tran
(74) *Attorney, Agent, or Firm* — Blairtech Solution LLC

(57) ABSTRACT

FM radio transmitter is being widely used in portable devices as a convenient way to output audio contents to ubiquitously available FM radio receivers in cars or homes. However, the signal from the FM radio transmitter may be interfering with the signal being broadcast by an FM radio station. A scan system is incorporated into the FM radio transmitter to quickly and reliably identify a vacant channel for the FM radio transmitter to use. The scan system measures on-channel and out-of-channel signal quality and selects a best channel for transmission based on the measured on-channel and out-of-channel signal quality. The scan system is also incorporated into an FM radio receiver to quickly and reliably tune to a valid channel. The scan system selects the valid channel based on the measured on-channel and out-of-channel signal quality.

12 Claims, 5 Drawing Sheets

RADIO TRANSMITTER AND RADIO RECEIVER WITH CHANNEL CONDITION ASSESSMENT

CROSS REFERENCE TO RELATED APPLICATIONS

The present invention is a division of U.S. Non-Provisional patent application Ser. No. 12/473,281, filed on May 28, 2009, entitled "Radio Transmitter and Radio Receiver with Channel Condition Assessment", which claims priority to U.S. Non-Provisional patent application Ser. No. 12/137,535, filed on Jun. 11, 2008, entitled "Frequency Modulation (FM) Clear Channel Scanning System and Method of Using Same." The U.S. Non-Provisional patent applications are hereby incorporated by reference in their entireties

FIELD OF THE INVENTION

The present invention generally relates to radio transmitters and radio receivers and particularly to a FM radio system and method of using same incorporating channel condition assessment.

DESCRIPTION OF THE PRIOR ART

FM (Frequency Modulation) radio transmitter has been widely used in portable devices such as cellphone, MP3 (MPEG-1 Audio Layer 3) player, PDA (Portable Digital Assistant), and PMP (Portable Media Player) to output audio contents on the device to an external FM audio receiver. The FM radio provides an instant wireless audio link between the portable device and the FM audio receiver that is available almost everywhere worldwide. This wireless link allows a user to playback the audio contents onto the FM radio receiver in a car for safer driving. Also a user may enjoy the better audio quality usually available in a car or home radio receiver. The FM radio transmitter may comply with the worldwide FM audio broadcast standard (for example, the FM broadcast system in US occupying a nominal spectrum from 87.5 to 108 MHz or any other similar FM systems). The radio transmitter may also be an AM (Amplitude Modulation) system that complies with the worldwide AM audio broadcast system (for example, the AM broadcast system in US occupying the nominal spectrum from 520 to 1710 kHz or other similar AM systems.

On the other hand, FM radio receiver is even more widely used in portable devices such as cellphone, MP3, PDA, and PMP. The FM radio receiver provides a user the convenience to enjoy FM radio listening experience anywhere anytime. Paired with a portable device equipped with an FM transmitter, the portable devices may share audio contents among them. In another application, the FM receiver may be used as a wireless earphone to be paired with a portable device equipped with an FM transmitter.

In the radio transmitter application, scanning for and finding an unoccupied or vacant channel for transmission and avoiding interference with licensed broadcast or other undesirable channels is highly desirable in an effort to increase efficiency and quality and to take advantage of such available channels. If the selected channel for transmission is also being used by a local broadcast radio station, the transmission from the portable device will interfere with the signal being transmitted from the local radio station. This will result in poor reception quality of the signal from the portable device, or otherwise the portable device may have to transmit at a much higher power level to "over-power" the local radio station which may interfere with the intended reception of the local radio and may violate the regulatory compliance. Consequently, it is extremely important to scan for an unoccupied channel before the portable device starts to transmit.

As an example, currently, in the United States, the frequency modulation (FM) broadcast band falls generally within 87.5 to 108.0 megahertz (MHz). Existing FM scanning systems use spectrum analysis to identify vacant (or available) channels. In doing so, a received signal strength indicator (RSSI) is used. The RSSI is a measurement of the power present in a received radio signal. The RSSI typically consists of a one-byte integer value. A value of 1 indicates the minimum signal strength detectable, while a value of 0 indicates no detectable signal. Current scanning systems identify vacant channels based solely on the RSSI measurement. If the RSSI is higher than a specified threshold, then the candidate channel is identified as occupied, and if the RSSI is lower than a specified threshold, the candidate channel is identified as vacant. This strategy fails to take into account of the noise leakage of neighboring occupied channels. Open (or available) channels surrounded by neighboring channels with high RSSI strengths require greater receiver performance for clear reception. However, open channels without high RSSI strength neighbors are received clearly by receivers with lesser performance capability.

Existing scanning systems fail to accurately identify open channels with low RSSI strength neighbors. Existing scanning systems search for open channels by making a single pass through the entire range. This method of scanning is time consuming, and suffers from poor accuracy.

Existing scanning systems also fail to utilize past scan results when identifying open and occupied channels. Because different channels may have different strengths at different distances, each scan of the range may return with different results. Therefore, the reliability of the scanning results suffers because the results of past scans go unutilized. Therefore, it is desirable to identify an open channel that is free from potential interference from strong neighboring channels to ensure high quality transmission at the identified open channel.

In the radio receiver applications, automatically tuning to a channel having a good signal quality is a convenient feature. This is particularly important for portable devices where the usage of the devices is often in a mobile environment such as walking, jogging, and driving. Again, existing FM radio receivers often use automatically tuning systems based on spectrum analysis to identify strong-signal channels. In doing so, a received signal strength indicator (RSSI) is often used. This strategy may identify a channel with signals spilt from strong neighboring channels. The identified channel may result in poor audio quality due to the interference from neighboring channels having strong signal strength. Therefore, a reliable automatic tuning or automatic seek is very desirable for radio receivers in portable devices. Furthermore, the scan system should also assess the possible interference of the identified channel and provide estimated parameters to the receiver to alleviate the potential interference.

In light of the foregoing, the need arises for a scanning system with improved accuracy, speed, and reliability of identifying a vacant channel in the radio transmitter application. On the other hand, there is a need for a reliable automatic tuning or automatic seek for radio receivers in portable devices to quick and reliably tune to a channel with good signal quality.

BRIEF SUMMARY OF THE INVENTION

The present invention provides radio transmitter systems and radio receiver systems incorporating a scan system to select a channel for transmitting or receiving respectively.

In one embodiment, a radio transmitter incorporates a scan system to select a channel for transmission, wherein the transmitter accepts an audio input signal and uses transmit path circuits to provide a transmission signal, and the scan system receives signals from a receive antenna and measures on-channel signal quality and out-of-channel signal quality of the received signal so as to select the channel for the radio transmitter.

In another embodiment, a radio transmitter incorporates a scan system using two or more sub-bands to select a channel for transmission, wherein the transmitter accepts an audio input signal and uses transmit path circuits to provide a transmission signal, and the scan system receives signals from a receive antenna and measures on-channel signal quality and out-of-channel signal quality of the received signal so as to select the channel across all sub-bands for the radio transmitter.

In yet another embodiment, a radio transmitter incorporates a scan system to select a channel for transmission, wherein the transmitter accepts an audio input signal and uses transmit path circuits to provide a transmission signal, and the scan system receives signals from a receive antenna and measures on-channel signal quality and out-of-channel signal quality of the received signal so as to select the channel for the radio transmitter, wherein parts of the scan system may be implemented in the radio transmitter system.

In an alternative embodiment, a radio transmitter incorporates a scan system to select a channel for transmission, wherein the radio transmitter and the scan system share an antenna.

In one embodiment, a radio receiver incorporates a scan system to select a channel for receiving, wherein the receiver accepts a signal from a receive antenna and uses receive path circuits to generate an output audio, and the scan system receives signals from the receive antenna and measures on-channel signal quality and out-of-channel signal quality of the received signal. The scan system generates the channel for the radio receiver to tune based on the on-channel signal quality. Furthermore, the scan system provides the out-of-channel signal quality to the radio receiver so that the radio receiver can apply digital signal processing matched to the out-of-channel signal quality to optimize audio quality.

In another embodiment, a radio receiver incorporates a scan system to select a channel for receiving, wherein the receiver accepts a signal from a receive antenna and uses receive path circuits to generate an output audio, and the scan system receives signals from the receive antenna and measures on-channel signal quality and out-of-channel signal quality of the received signal so as to generate the channel for the radio receiver to tune, wherein the scan system is implemented in the radio receiver.

The foregoing and other objects, features and advantages of the present invention will be apparent from the following detailed description of the preferred embodiments which make reference to several figures of the drawing.

DETAILED DESCRIPTION

Figure 1:
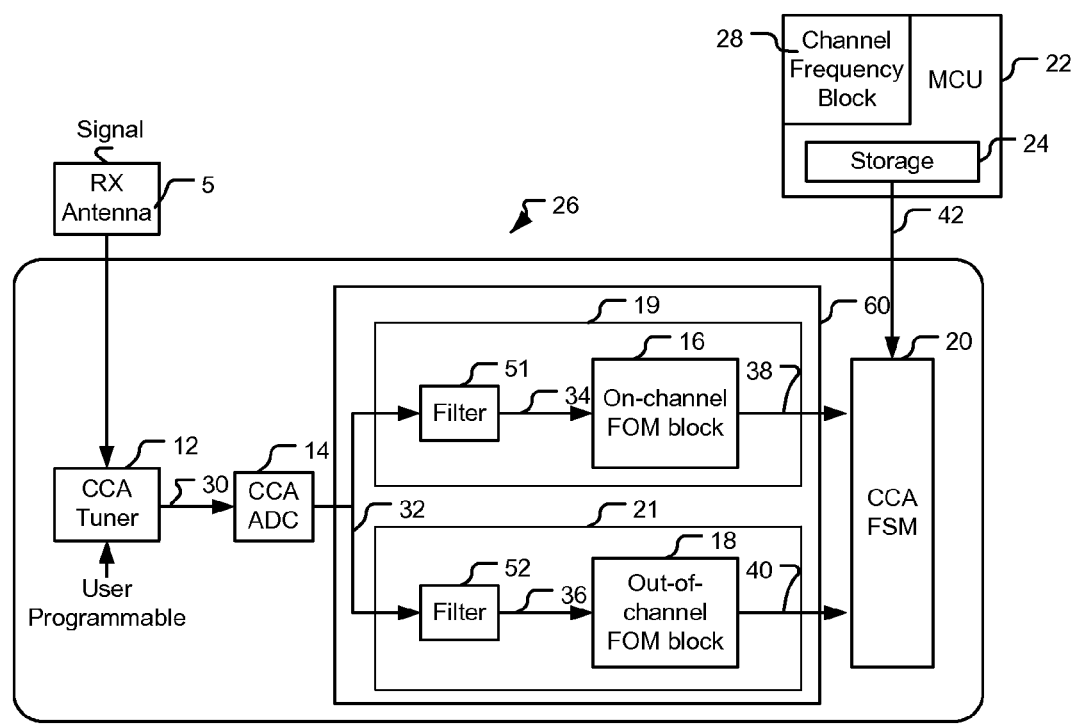
FIG. 1 shows a block diagram of FM clear channel scan system.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1 to 5. However, those skilled in the art will readily appreciate that the detailed description given herein with respect to these figures is for explanatory purposes as the invention extends beyond these limited embodiments.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

In one embodiment of the present invention, the scan system uses adjacent and alternative channel conditions to find a vacant or unoccupied channel within a band and provides the vacant channel as the transmitting channel. The adjacent channel is the channel which is immediately above or below the designated channel while the alternative channel is the channel which is at two channel spacing above or below the designated channel. Different decision metric is used to find the best channel. Two fast signal level detectors are used, one to measure the on-channel signal level and another to measure the signal level of adjacent and alternative (or out-of-channel) channel signal levels. Scanning of channels within the band is done by initializing a search to compare the on-channel signal level, $V_s$, of a particular channel with a predetermined threshold, $V_{ith}$. If it is determined that $V_s$ is larger than or equal to $V_{ith}$, the particular channel is rejected, however, if $V_s$ is smaller than $V_{ith}$, the on-channel signal level to the out-of-channel signal level ratio, CIR, is compared with a pre-determined threshold $CIR_{th}$. If CIR is less than $CIR_{th}$, the signal level $V_s$ is compared to find the channel with the lowest signal level and the found channel is declared the best channel. The signal level of the best channel is recorded. In a following scan, the signal level of the best channel is first read and compared with a recorded value and if there is no increase detected by a predetermined value, $V_{hys}$, the current best channel is used and nothing is updated, however, if the change is higher than $V_{hys}$, the process returns and continues from the initial searching step.

It should be noted that RSSI is an example of a measurement of the quality of the signal and other types of measurements, such as signal-to-noise ratio (SNR), center frequency deviation or others known to those skilled in the art or any combinations thereof is contemplated. In this respect, RSSI, as used herein, is an example of figure of merit (FOM) or quality measurement representing a measurement of the signal quality.

Dividing the bands into 'n' number of sub-bands advantageously allows the scan system to measure the RSSI value (or FOM) more accurately and in a shorter time period when compared with scanning the entirety of the FM band from beginning to end, as done by prior art techniques. This is so because the sub-bands can be scanned with a finer granularity than is generally done when an entire band is scanned.

Additionally, the scan system uses a digital signal processing (DSP)-based adaptive signal strength measurement which is advantageously faster than the current conventional system used by existing scanning systems. A DSP-based signal strength measurement system that is adaptive allows for programmable-setting its coefficients, which advantageously provides for faster tuning thereby improving system performance.

FIG. 1 shows a block diagram of the scan system 26, in accordance with an embodiment of the present invention. The scan system 26 is shown to include channel condition assessment (CCA) tuner 12, CCA analog-to-digital converter (ADC) 14, filter 51, filter 52, on-channel FOM block 16, out-of-channel FOM block 18 and CCA finite state machine (FSM) 20. RX Antenna 5 and microcontroller unit (MCU) 22 are shown coupled to scan system 26. The MCU 22 is shown to include storage 24 and channel frequency block 28. The RX Antenna 5 is shown coupled to the CCA tuner 12. The CCA Tuner 12 is shown coupled to the CCA ADC 14. The CCA ADC 14 is shown coupled to both the filter 51 and the filter 52. The filter 51 is shown coupled to the on-channel FOM block 16. The on-channel FOM block 16 is shown coupled to the CCA FSM 20. The filter 52 is shown coupled to the out-of-channel FOM block 18. The out-of-channel FOM block 18 is shown coupled to the CCA FSM 20. When using the scan system 26 in an FM band application, the CCA tuner 12 operates as an FM tuner. When using the scan system 26 in an AM band application, the tuner 12 operates as an AM tuner.

In some embodiments, the MCU 22 is located within the radio transmitter system or the radio receiver system. In other embodiments, the MCU 22 is located externally to the radio transmitter system or the radio receiver system. In some embodiments, the MCU 22 is part of the scan system 26 and in other embodiments, the MCU 22 is located externally to the scan system 26.

The filter 51 and the on-channel FOM block 16 collectively comprise the on-channel selection block 19. In some embodiments, the filter 51 and the on-channel FOM block 16 are physically the same block and in other embodiments, they appear as in FIG. 1 as separate structures. The filter 52 and the out-of-channel FOM block 18 collectively comprise the out-of-channel selection block 21. In some embodiments, the filter 52 and the out-of-channel FOM block 18 are physically the same block and in other embodiments, they appear as in FIG. 1 as separate structures.

RX Antenna 5 is shown to receive the signal, in the form of an analog signal, and to transmit the same to the tuner 12. Tuner 12 receives the analog signal is operative to select a single station by excluding substantially all others and to generate a tuned analog signal 30 for use by the ADC 14. Tuner 12 is user-programmable to select a start and stop frequency range and a step frequency and in this manner divides the band into multiple sub-bands.

In an exemplary embodiment, the selected step frequency is 200 kHz and the band is divided into sub-band. ADC 14 is operative to receive the signal 30 and to convert the same to digital signal 32. The signal 32 is then coupled onto filter 51 and filter 52. Filter 51 is designed to select substantially only the on-channel frequencies and to substantially disregard the out-of-channel frequencies from the signal 32 to generate the on-channel signal 34. Filter 52 is operative to select substantially only the out-of-channel frequencies and to substantially disregard the on-channel frequencies from the signal 32 to generate the out-of-channel signal 36.

The filter 51 is further operative to transfer the on-channel signals 34 to the on-channel FOM block 16. The on-channel FOM block 16 is operative to measure the FOM of the on-channel signals 34 (a measurement representing the measurement of signal quality of the on-channel signal), and the out-of-channel FOM block 18 is operative to measure the out-of-channel signals 36 (a measurement representing the measurement of signal quality of the out-of-channel signal). In one embodiment of the present invention, both blocks 16 and 18 use an adaptive time constant which advantageously allows for fast user-programming of settings (such as coefficients) and fast FOM calculation.

A scan of the band performed at a low bandwidth yields more accurate results, as more noise is removed, than a scan at a high bandwidth. However, scanning with the high bandwidth is less time-consuming to complete. The scan system 26 advantageously uses an adaptive time constant to yield accurate scans of the FM band in a short amount of time. The adaptive time constant changes to produce a scan that is very fast initially and then becomes increasingly slower. In an exemplary embodiment, the scan is performed at least five times faster than that realized by prior art techniques. The on-channel FOM block 16 is operative to generate an FOM on-channel signal 38 and the out-of-channel FOM block 18 is operative to generate an FOM out-of-channel signal 40, both of which are received by the CCA FSM 20.

The CCA FSM 20 is operative to ultimately select the best candidate open channel. The MCU 22 records the FOM measurements from the on-channel FOM block 16 and the out-of-channel FOM block 18 and calculates the on-channel to out-of-channel FOM ratio. More specifically, the signals 38 and 40 are used to calculate the on-channel to out-of-channel FOM ratio of these signals by dividing the signal 38 by the signal 40. The MCU 22 is further operative to compare the on-channel to out-of-channel FOM ratio to a programmable (predetermined) threshold value. If the calculated ratio is below the threshold, the channel is selected, and if the ratio is above the threshold, the channel is not selected. Alternatively, this comparison may be done by comparing the ratio to being above or equal to the threshold and/or less than or equal thereto. While the on-channel FOM may indicate an open channel or an un-occupied channel, i.e., low on-channel RSSI, a high out-of-channel RSSI indicates the existence a strong adjacent channel. This scenario may be indicated by a low on-channel FOM to out-of-channel FOM ratio.

The CCA FSM 20 is operative to perform the initial sub-band scan. That is, it compares the FOM of each of the channels within a sub-band to determine a candidate channel based on the channel with the lowest FOM. It is noted that alternatively, rather than performing the initial sub-band channel scan prior to the FOM that is performed for adjacent channels of the candidate channels, the initial sub-band channel scan may be done after the adjacent FOM channel determination.

It should be noted that practically, a hysteresis type of threshold is preferred in that rather than a specific value determining the threshold, the threshold is a range below which, the channel is selected and above which the channel is not selected or vice versa. In one embodiment of the present invention, MCU 22 is operative to compare the on-channel to out-of-channel FOM ratio to a hysteresis range of thresholds having an upper range and a lower range, wherein the FOM ratio being below the range indicates that the channel is to be selected, and the FOM ratio being above the range indicates that the channel is not to be selected The MCU 22 is operative to integrate the hardware-based system 26 with block 28 and storage 24. Both block 28 and storage 24 are included in the MCU 22, in an exemplary embodiment. It is understood however, that they may be executed elsewhere or each on a different platform. Block 28 is operative to specify the start and stop frequency range and step frequency used by system 26 and optionally to maintain a history of "best" channel and update the same periodically. Storage 24 is operative to store past open channel search results. Storage 24 is optional but when used improves tuning by allowing for a more accurate selection of an open channel because periodic scans are performed and used to compare to a previous (or current) "best" channel and if an improvement is noted over the current best channel, the best channel is updated to be the that which showed an improvement. In this manner, a history is maintained and "best" channel is updated to track the current surroundings of the system 26. This is advantageous particularly when the system 26 is used in a portable device and the location of the portable device changes.

The scan system 26 can also be used in a radio receive system to help locate a channel presumably having a good signal quality. The feature for a radio receive to automatically tune to a channel with good signal quality is often called auto seek or auto search in the field. This is a useful and convenient and improves user experience with radio listening. Opposite to the radio transmitter applications where the goal is to identify an un-occupied or vacant channel, the goal for the scan system in the radio receiver applications is to identify a channel with good signal level which presumably delivers good quality. This conventional approach works satisfactorily to a certain degree. However, there are always cases that the criterion solely based on received signal strength fails to pick a good channel.

In real world environment, the signals received at a receive antenna represent a summation of all radio signals from various sources propagated through their paths to the receive antenna. In an urban environment where a receiver may be surrounded by many tall buildings blocking a line-of-sight path between the receiver and a transmitting radio station and causing severe multi-path scenario where the signal arrives at the receive antenna from multiple routes. The multiple copies of the signals may interfere with themselves and result in poor audio quality even though the received signal level may be high. In another scenario, a received signal level may be good enough to deliver a good audio quality if there were no strong signal in the adjacent channels. A criterion solely based on the on-channel signal level may fail to distinguish when a good audio quality may be achieved.

The scan system 26 in the current invent can examine the on-channel FOM as well as the out-of-channel FOM and make a decision about the quality of the channel. In one exemplary case, the scan system 26 may compare the on-channel FOM with a threshold $V_R$ and skip the channel if the on-channel FOM is below the threshold $V_{R1}$. If the on-channel FOM is above the threshold $V_R$, the out-of-channel FOM will be checked. If the out-of-channel FOM is above a threshold $V_{R2}$, the channel is skipped. Otherwise the channel is selected as a valid channel.

While the above exemplary usage of the scan system 100 for a radio receiver system compares the on-channel FOM and out-of-channel FOM with respective thresholds as a method to determine whether the channel is a valid channel or not, it will be apparent, however, to one skilled in the art, many other criteria may be applicable as well to achieve the same or similar results.

Figure 2:
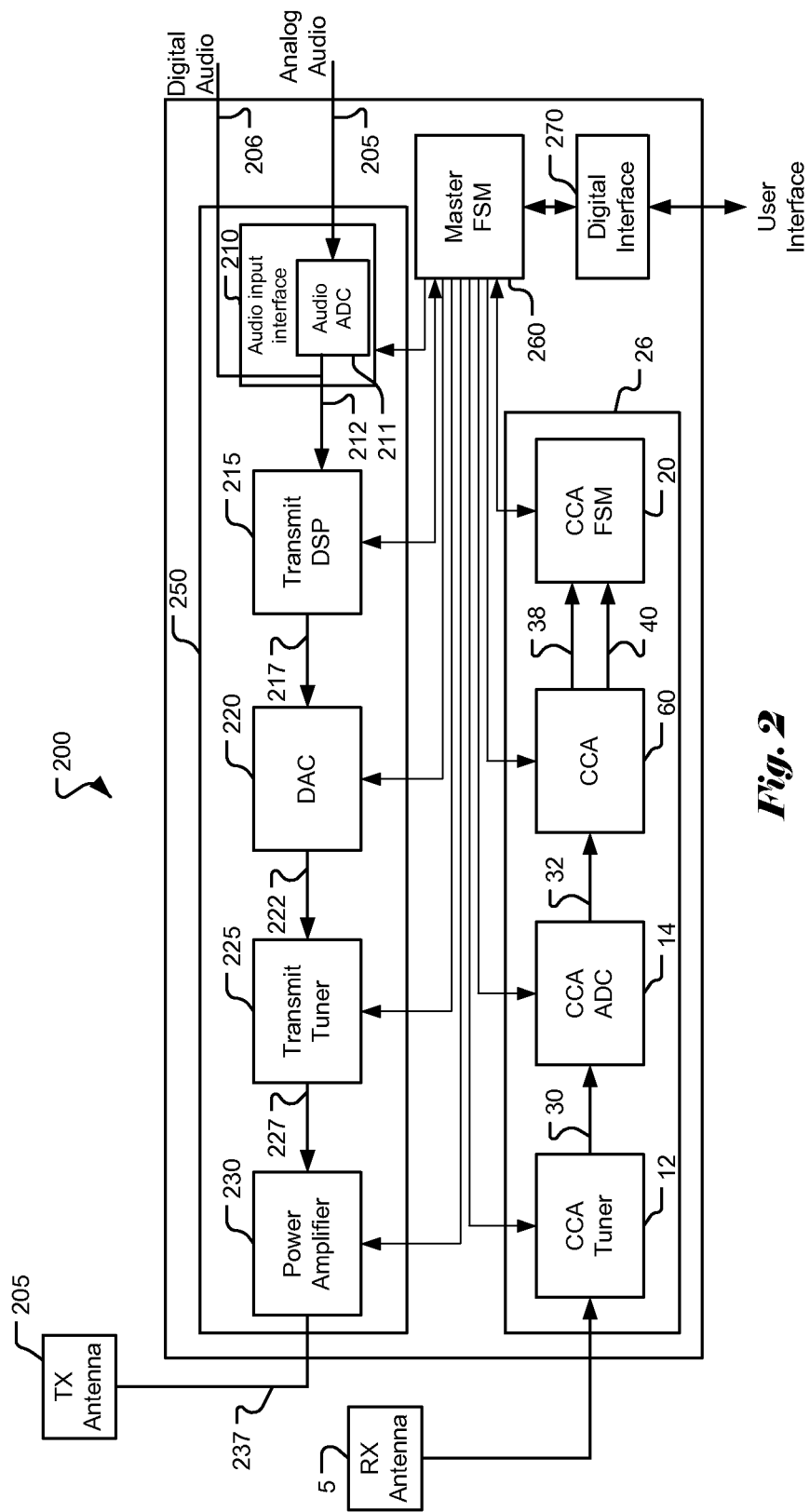
FIG. 2 shows a block diagram of a radio transmitter system incorporating transmit path circuits and a scan system.

FIG. 2 shows a block diagram of a radio transmitter system 200 incorporating the scan system invention. The radio transmitter system mainly comprising three components: transmit path circuits 250, the scan system 26, and a master FSM 260. The transmit path circuits 250 receives audio signal from the audio input interface 210 and performs a chain of processing to convert the audio signal into radio frequency signal for transmission through the TX antenna 205. The chain of processing may comply with an FM modulation standard such as the US FM broadcasting in the 88 to 108 MHz band or an AM modulation standard. The audio input interface accepts a supplied audio signal either in an analog or a digital format. If the audio signal is in the analog format, the analog signal will be coupled to audio ADC 211 through signal line 205. If the audio signal is in the digital format, it will be coupled to the audio interface 210 through signal line 206 without passing through the audio ADC 211. The signal 212 from the audio interface 210 is then passed to transmit digital signal processing (DSP) block 215.

The transmit DSP plays a key role as to convert the audio input signal into a modulated signal suited for transmission. In the example for transmission complying with US FM broadcast in the 88 to 108 MHz band, the transmit DSP block 215 will perform audio pre-emphasis on the audio signal and create FM multiplexed stereo audio. The FM multiplexed stereo audio is then subject to FM modulation done digitally by the transmit DSP block 215 and the digitally modulated FM signal is then outputted to digital-to-analog (DAC) converter 220 through signal line 217. This FM modulated signal in the analog format is ready for transmission at a selected FM channel.

The transmit tuner 225 receives the analog modulated signal from the DAC 220 through signal line 222. The transmit tuner translates the analog modulated signal to a channel in the FM band by mixing the analog modulated signal with a mixing signal which is typically generated from a local oscillator (LO). A target transmitting frequency is usually achieved by mixing the analog modulated signal with an appropriate LO frequency. In order to deliver high quality audio, the channel selected preferably is free from possible interferences from FM broadcast stations or other radiation sources. The scan system is incorporated in the system for the purpose to determine a best channel for the system to transmit. An optional power amplifier 230 is shown in FIG. 2 if high power transmission is desired. The power amplifier 230 receives the modulated signal up converted to the FM band from signal line 227 and output the amplified signal to TX antenna 205 through signal line 237.

The master FSM 260 provides all needed control and communication to various parts of the system. For example, the master FSM 260 may accept the channel selected by the CCA FSM 20 of the scan system 26 and uses it to select the transmitting frequency for the transmit tuner 225. The FSM is well known in the art and has been widely used for system control that does not require complex control. The FSM has known for its advantages of simplicity in implementation and quick in execution. For the intended use in the radio transmit system or the radio receive system where many system parameters such as the on-channel FOM and the out-of-channel FOM are computed by the digital signal processing, i.e., the CCA block in the scan system, the FSM control is mainly for making deterministic decision based on the computed parameter. Therefore, the required decision making by the FSM is relatively light. Therefore, the FSM approach as a system control matches with the intended system nicely.

In FIG. 2, two separate antennas 5 and 205 are shown. For the cost-saving reason, a single antenna can be shared by the scan system 26 and the transmit path circuits 250. When a shared antenna is used, the system will cease transmission when the scan system 26 is connected to the shared antenna and receives signals. Since a new channel search is needed before initial transmission or the system is experiencing interference resulting in poor audio quality, ceasing transmission momentarily for the scan system to search for a new channel will not cause operational inconvenience.

In FIG. 2, an optional digital interface 270 is shown. The digital interface 270 serves to provide user interface to the master FSM 260. For example, a user may desire to increase the transmit power by adjusting the power amplifier 230. The user's input may be entered through the digital interface 270 into the master FSM 260. The master FSM 260 then controls the output power for the power amplifier 230.

Figure 3:
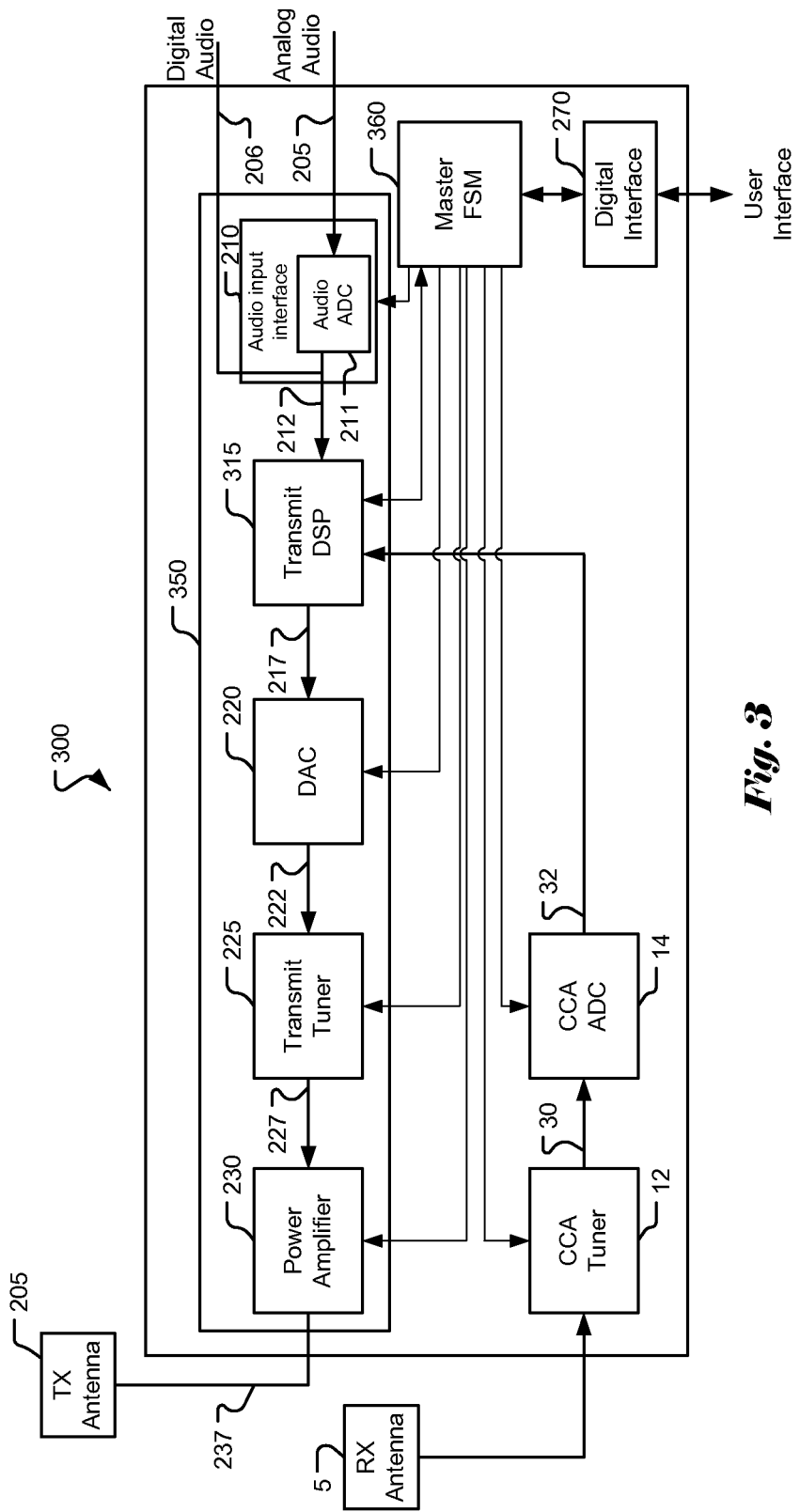
FIG. 3 shows a block diagram of a radio transmitter system incorporating transmit path circuits and a scan system where parts of the scan system are implemented in the radio transmit circuits.

FIG. 3 shows an alternative radio transmit system 300 incorporating the scan system 26 wherein parts of the scan system are implemented in the transmit path circuits 350. As described previously, the scan system uses a digital signal processing (DSP)-based adaptive signal strength measurement. The DSP-based signal strength measurement corresponding to the CCA block 60 can be performed or mostly performed by the transmit DSP block 215. Therefore it will be advantageous to reuse the available resources in the transmit DSP block 215 and to augment it with other components required to perform the function of CCA block 60. The augmented transmit DSP block that is capable of performing the function of the CCA block 60 is shown in FIG. 3 as the transmit DSP block 315.

On the other hand, the CCA FSM 20 may be merged into the master FSM 260 though few resources can be shared between the CCA FSM 20 and the master FSM 260. Merging the CCA FSM 20 and the master FSM 260 will make the system partition conceptually simpler and may also slightly reduce the overall gate count if the system is implemented in integrated IC. The combined FSM is shown in FIG. 3 as master FSM 360.

Again, the TX antenna 205 and the RX antenna 5 may share the same antenna as described previously.

Figure 4:
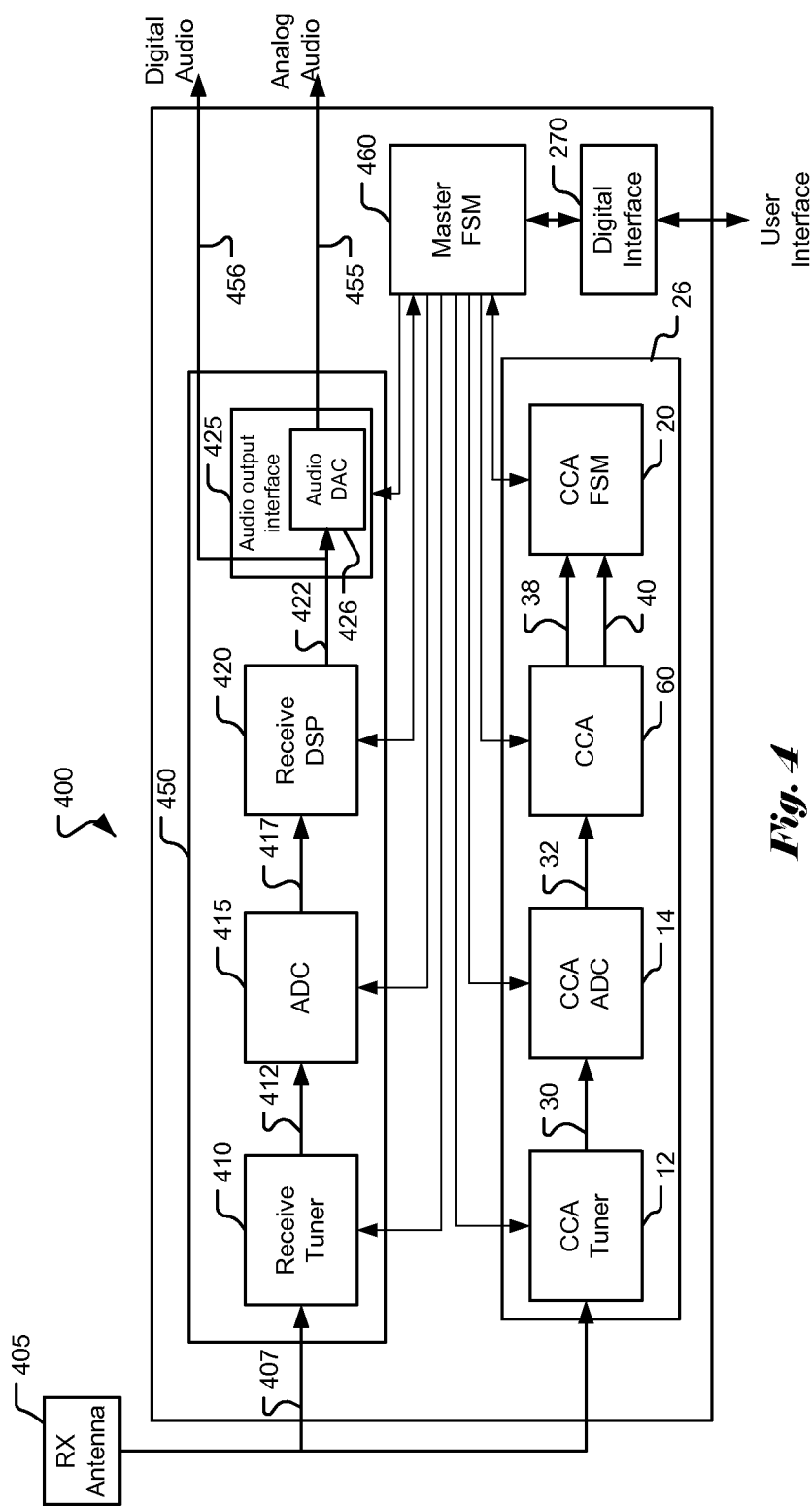
FIG. 4 shows a block diagram of a radio receiver system incorporating receive path circuits and a scan system.

FIG. 4 shows a radio receiver system 400 incorporating the scan system 26. The radio receiver system 400 comprises primarily three major components: receive path circuits 450, the scam system 26 and master FSM 460. The receive path circuits 450 are coupled to RX antenna 405 to receive signals in a band through the signal line 407. The receive tuner 410 will be tuned to a channel of the received signal wherein the frequency of the tuned channel can be controlled. The analog-to-digital converter (ADC) 415 converts the received signal 412 into a digital signal 417. The receive DSP block is responsive for a chain of digital signal processing. For an FM broadcast receiver, the receive DSP block will perform channel filtering, digital demodulation on the digitized received signal 417, FM stereo de-multiplexing of the demodulated signal into a pair of digital audio, and de-emphasis of the pair of digital audio. The generated digital audio signal 422 can be outputted through the audio output interface 425 as the digital audio output signal 456 or passed through the audio digital-to-analog converter (DAC) 426 to provide an analog audio output 455. The channel filtering for a selected channel is well known in the art and its main purpose is to selectively pass the desired signal while blocking un-wanted signal. Filters for the channel filtering are usually characterized by the bandwidth, pass-band ripples, stop band ripples, roll-off factor, and etc. A set of filters or filters with a set of programmable parameters with desired characteristics may be used and the one best matched with the underlying channel condition may be selected. In order to simplify filter design to fulfill the required channel filtering, often a model filter having programmable parameters or coefficients is used, such as Butterworth bandpass filter, is used.

The scan system 26 will be responsible to select a valid channel for the receive path circuits to tune to. The CCA FSM 20 will be configured to output a channel which has a high on-channel FOM and a low out-of-channel FOM. This is an indication that the channel may have good quality and is free from potential interference from neighboring channels. For the radio receiver to receive this channel and produce a best audio quality, a full bandwidth filter to pass the channel can be used without concerning possible interference from neighboring channels. However, there are cases that a channel may show a high on-channel FOM and a high out-of-channel FOM as well. This is an indication that while the selected channel may be valid, it is subject to potential interference from neighboring channels, To minimize the possible interference without noticeably degrading the quality of the selected channel, a channel filter matched to the on-channel and out-of-channel conditions has to be used, Therefore, a set of channel filters may be used to control the channel filtering and the selection of the filters is related to the out-of-channel FOM. As will be understood by a skilled person in the art, many other criteria may be used by the CCA FSM to select a channel and to control the channel filtering that will result in good audio quality.

The master FSM 460 is responsible for control and communication with various parts of the system. For example, the master FSM 460 will accept the channel selected by the CCA FSM 20 and cause the receive tuner 410 to tune to the selected channel.

FIG. 4 also shows an optional digital interface 270 allowing a user's input to be entered through the digital interface 270 into the master FSM 460.

Figure 5:
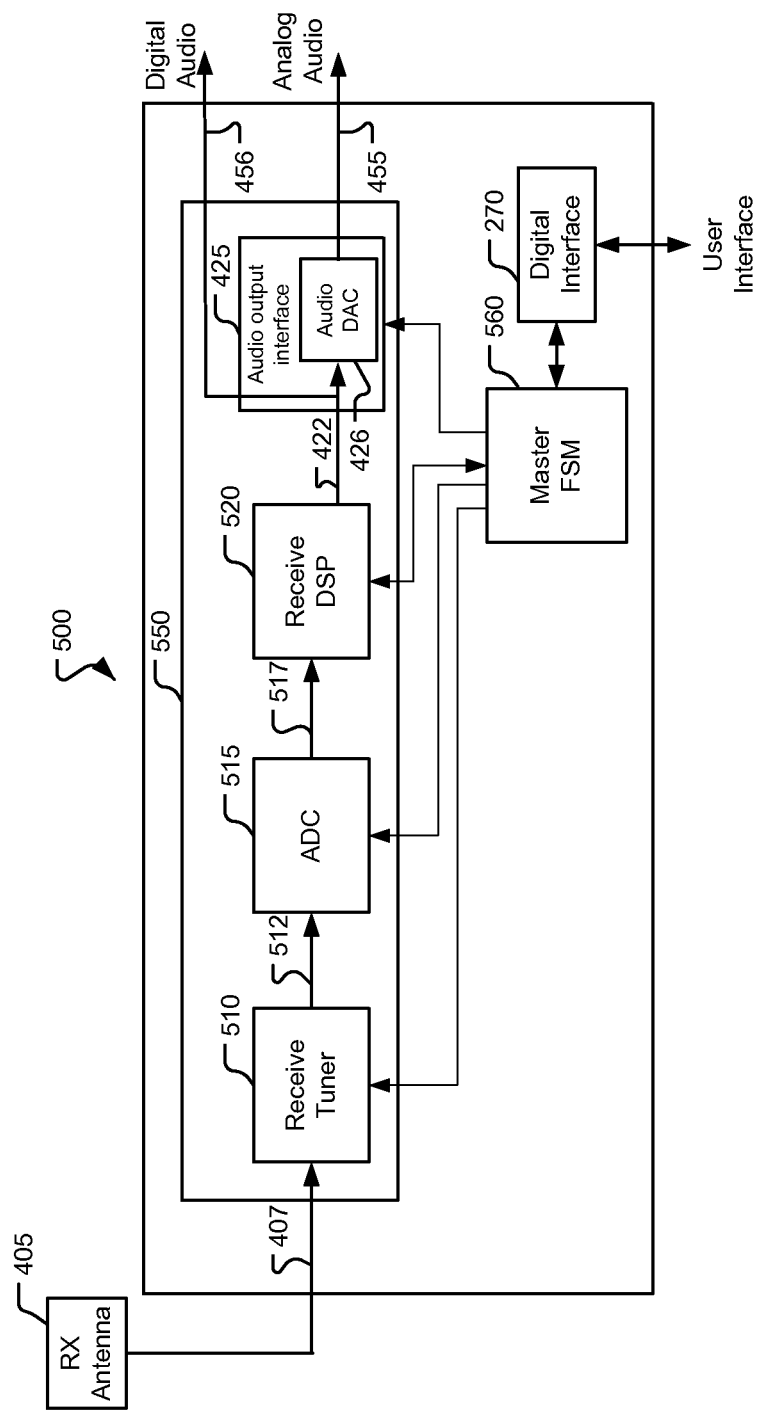
FIG. 5 shows a block diagram of a radio receiver system incorporating receive path circuits and a scan system where parts of the scan system are implemented in the radio receive circuits.

FIG. 5 shows a radio receiver system 500 incorporating the scan system 26 wherein the scan system is implemented in the receive path circuits 550 and the master FSM 560. The receive tuner 510 can be configured to be used as a radio receiver tuner or a CCA tuner depending on whether the system is under radio receiving mode or auto seek mode. The output signal 512 can be either a tuner radio channel or a tuned CCA signal. Since the ADC 415 and CCA ADC 14 in FIG. 4 have similar characteristics and they can share the same ADC 515 as shown in FIG. 5. The receive DSP block 520 receives the digitized signal 517 and can be configured as a radio receiver DSP or a CCA DSP. When the receive DSP block 520 is configured as a radio receiver DSP, it will output digital audio signal 422. When the receive DSP block 520 is configured as a CCA DSP, it will provide the on-channel FOM and the out-of-channel FOM to the master FSM 560 to select a valid channel.

The transmit DSP block and receive DSP block are referring to devices or means that are capable of performing required signal processing digitally. The transmit DSP block and receive DSP block may be a device such as a programmable digital signal processor, a CPU, a microcontroller, digital logics, or other forms of device capable of performing signal processing digitally. The DSP means may be implemented as instruction codes stored in computer readable storage media, generally known as software or firmware. Also the transmit DSP block and receive DSP block may be a mixed of device and means. For example, a particular type of operation, such as multiplication, may be implemented by a dedicated device while other operations such as decision making and data movement may be implemented in software or firmware executed on a microcontroller.

Thus, in accordance with the various embodiments of the present invention, a radio transmit system and a radio receive system incorporating the scan system are disclosed. The systems are partitioned into various component blocks to fulfill the required processing. However, it is understood by a skilled person in the art that there are many different ways to partition a radio transmit system or a radio receive system to achieve the same goal.

As known by one of ordinary skill in the art, this invention, including any logic circuit (block) or transistor circuit, may be modeled, generated, or both by computer based on a description of the hardware expressed in the syntax and the semantics of a hardware description language (HDL). Such HDL descriptions are often stored on a computer-readable medium. Applicable HDLs include those at the layout, circuit netlist, register transfer, and/or schematic capture levels. Examples of HDLs include, but are not limited to: GDS II and OASIS (layout level); various SPICE languages, and IBIS (circuit netlist level); Verilog and VHDL (register transfer level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

What is claimed is:

1. An integrated radio receiver comprising:
   a receive antenna interface;
   an audio output interface;
   receive path circuits coupled to the receive antenna interface and audio output interface, wherein the receive path circuits include a receive tuner having a tunable receiving frequency and a receive digital-signal-processing block having controllable channel filtering;
   a scan system operative to receive signals within a band from the receive antenna interface and to generate a valid channel and a channel filtering control parameter; and
   a master finite state machine (FSM) coupled to the receive path circuits and the scan system to provide control and communication,
   wherein the valid channel generated by the scan system is applied to select a receiving frequency for the receive path circuits and the channel filtering control parameter is applied to control the channel filtering, and
   wherein the scan system comprises:
      a channel condition assessment (CCA) tuner coupled to the receive antenna interface and operative to tune within the band and operative to generate a tuned analog signal;
      a CCA analog-to-digital converter (ADC) coupled to the CCA tuner and operative to convert the tuned analog signal to a digital signal;
      an on-channel selection block responsive to the digital signal and operative to generate a on-channel signal by selecting only on-channel frequencies and substantially disregarding out-of-channel frequencies from the digital signal and operative to generate an on-channel figure of merit (FOM) representing a signal quality measurement of the on-channel signal; and
      an out-of-channel selection block responsive to the digital signal and operative to generate an out-of-channel signal by selecting only the out-of-channel frequencies and substantially disregarding the on-channel frequencies from the digital signal and operative to generate an out-of-channel FOM representing the signal quality measurement of the out-of-channel signal.

2. The integrated radio receiver of claim 1, wherein the scan system further including a CCA finite state machine (FSM) responsive to the on-channel FOM and the out-of-channel FOM and operative to select the valid channel based on the on-channel FOM and to select the channel filtering control parameter based on the out-of-channel FOM.

3. The integrated radio receiver of claim 1, wherein integrated radio receiver includes a digital interface coupled to the master FSM for providing a user interface to the master FSM.

4. The integrated radio receiver of claim 1, wherein the scan system uses an adaptive scan time.

5. An integrated radio receiver comprising:
   a receive antenna interface;
   an audio output interface;
   receive path circuits coupled to the receive antenna interface and audio output interface, wherein the receive path circuits include a receive digital signal processing (DSP) block having controllable channel filtering, an analog-to-digital converter (ADC) and a receive tuner having a tunable receiving frequency;
   a scan system operative to receive signals within a band from the receive antenna interface and to generate a valid channel and a channel filtering control parameter, the scan system comprising:
      (a) means responsive to the received signal in the band to tune and operative to generate a tuned analog signal;
      (b) means for converting the tuned analog signal to a digital signal;
      (c) means responsive to the digital signal for generating an on-channel signal by selecting on-channel frequencies thereof and substantially disregarding out-of-channel frequencies thereof and for generating an on-channel figure of merit (FOM) representing a signal quality measurement of the on-channel signal;
      (d) means responsive to the digital signal for generating an out-of-channel signal by selecting the out-of-channel frequencies thereof and substantially disregarding the on-channel frequencies thereof and for generating an out-of-channel FOM representing the signal quality measurement of the out-of-channel signal;
      (e) means for selecting a best channel within the band based on the on-channel FOM as the valid channel; and
      (f) means for selecting the channel filtering control parameter based on the out-of-channel FOM; and
   a master finite state machine (FSM) coupled to the receive path circuits and the scan system to provide control and communication,
   wherein the valid channel generated by the scan system is applied to select the receiving frequency for the receive path circuits and the channel filtering control parameter is applied to control the channel filtering.

6. The integrated radio receiver of claim 5, wherein the means responsive to the received signal in the band to tune and operative to generate the tuned analog signal is implemented in the receive tuner.

7. The integrated radio receiver of claim 5, wherein the means for converting the tuned analog signal to a digital signal is implemented in the ADC.

8. The integrated radio receiver of claim 5, wherein the means for the on-channel FOM and the means for out-of-channel FOM are implemented in the receive DSP.

9. The integrated radio receiver of claim 5, wherein the means for selecting the best channel as the valid channel is implemented in the master FSM.

10. The integrated radio receiver of claim 5, wherein the receive path circuits further comprises an audio digital-to-analog converter (DAC) to accommodate an analog audio output signal.

11. The integrated radio receiver of claim 5, wherein integrated radio receiver includes a digital interface coupled to the master FSM for providing a user interface to the master FSM.

12. The integrated radio receiver of claim 5, wherein the scan system uses an adaptive scan time.

* * * * *